(12) United States Patent
Kodera

(10) Patent No.: US 7,477,104 B2
(45) Date of Patent: Jan. 13, 2009

(54) POWER AMPLIFIER CIRCUIT AND TEST APPARATUS

(75) Inventor: Satoshi Kodera, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/777,296

(22) Filed: Jul. 13, 2007

(65) Prior Publication Data

US 2008/0036539 A1 Feb. 14, 2008

Related U.S. Application Data

(63) Continuation of application No. PCT/JP2006/302196, filed on Feb. 8, 2006.

(30) Foreign Application Priority Data

Feb. 10, 2005 (JP) ............................. 2005-034686

(51) Int. Cl.
*H03F 3/18* (2006.01)
(52) U.S. Cl. ..................... 330/264; 330/262; 330/263; 330/265
(58) Field of Classification Search ................ 330/262, 330/263, 264, 265
See application file for complete search history.

(56) References Cited

U.S. PATENT DOCUMENTS

| | | | | | |
|---|---|---|---|---|---|
| 4,041,408 | A | * | 8/1977 | Trotnick, Jr. ................ | 330/273 |
| 4,866,398 | A | * | 9/1989 | Gulczynski .................. | 330/263 |
| 4,959,623 | A | * | 9/1990 | Khoury ....................... | 330/265 |
| 5,578,966 | A | * | 11/1996 | Mills ........................... | 330/263 |
| 6,414,549 | B1 | * | 7/2002 | Barbetta ...................... | 330/264 |
| 6,792,121 | B2 | * | 9/2004 | Koyama et al. ............. | 381/120 |

FOREIGN PATENT DOCUMENTS

| | | |
|---|---|---|
| JP | 52-010753 | 1/1977 |
| JP | 01-169810 | 7/1989 |
| JP | 05-067932 | 3/1993 |
| JP | 06-331700 | 12/1994 |
| JP | 2003-046347 | 2/2003 |
| WO | WO2006/085566 | 8/2006 |

\* cited by examiner

*Primary Examiner*—Patricia Nguyen
(74) *Attorney, Agent, or Firm*—Osha • Liang LLP

(57) ABSTRACT

Power amplifier circuit outputs an output voltage corresponding to an input voltage supplied, and includes positive and negative-side output units including a positive or negative-side output resistor and a positive or negative-side transistor having its source terminal connected to one end of the positive or negative-side output resistor to make a current corresponding to a voltage supplied to its gate terminal flow to the positive or negative-side output resistor, positive and negative-side bias generating units which generate a positive or negative-side bias voltage corresponding to the input voltage, and positive and negative-side control units which control the voltage to be applied to the gate terminal of the positive or negative-side transistor such that the positive or negative-side bias voltage and source voltage of the positive or negative-side transistor become generally equal, and the voltage at connection node between the positive and negative-side output units is output as the output voltage.

20 Claims, 7 Drawing Sheets

POWER AMPLIFIER CIRCUIT AND TEST APPARATUS

CROSS REFERENCE TO RELATED APPLICATION

This is a continuation application of PCT/JP2006/302196 filed on Feb. 8, 2006 which claims priority from a Japanese Patent Application No. 2005-034686 filed on Feb. 10, 2005, the contents of which are incorporated herein by reference.

BACKGROUND

1. Technical Field

The present invention relates to a power amplifier circuit and a test apparatus. Particularly, the present invention relates to a power amplifier circuit which outputs an output voltage corresponding to an input voltage supplied thereto, and a test apparatus which tests a device under test.

2. Related Art

Conventionally, in testing a device under test such as a semiconductor circuit, etc., power source electricity for driving the device under test is supplied to the device under test. This power source electricity is generated by a power amplifier circuit.

The power amplifier circuit outputs a power source voltage corresponding to an input voltage supplied thereto, or outputs a power source current according to a current that has been consumed by the device under test. Conventionally, a push-pull circuit which includes two transistors functioning as power devices is used as the power amplifier circuit. A push-pull circuit is a circuit that adjusts the active nodes of the power devices to be at desired regions, by making an idling current flow through the power devices while outputting no power source current.

Presently, no related patent literature whatsoever has been identified, so indication of any literature is omitted.

The idling current of the power amplifier circuit changes according to the characteristics of the power devices. For example, even power amplifier circuits that have the same configuration might not have equivalent idling currents flow therethrough, due to any variations in the characteristics of the power devices thereof. Therefore, in some cases, the characteristics of the power amplifier circuit do not meet the design values. Further, in a case where a plurality of power amplifier circuits are used in parallel, the power amplifier circuits might show inconsistent characteristics.

Furthermore, the amount of the current flowing through the power devices changes as the temperature changes. Therefore, from when the power amplifier circuit is turned on till when the power amplifier circuit enters a static state, the idling current continues fluctuating and the characteristics of the power amplifier circuit also continue fluctuating.

Moreover, if such a power amplifier circuit is used in testing the device under test, a desired power source electricity might not be supplied to the device under test and a test of a high accuracy might not be conducted.

Though it is a conceivable option to insert a resistor having a high resistance at the output stage of the power amplifier circuit to reduce any influences caused by such variations, etc. in the characteristics of the power devices, this would degenerate the output impedance and also require a high voltage to be applied to the power devices in order for them to be driven, necessitating an increase in the power to be consumed by the power amplifier circuit.

SUMMARY

Hence, it is an object of one aspect of the present invention to provide a power amplifier circuit and a test apparatus which can solve the above-described problems. This object will be achieved by combinations of the features recited in the independent claims in the scope of claims. Further, the dependent claims will define additional advantageous specific examples of the present invention.

That is, according to a first mode of the present invention, there is provided a power amplifier circuit which outputs an output voltage corresponding to an input voltage supplied thereto, and includes a positive-side output unit including a positive-side output resistor and a positive-side transistor having its source terminal connected to one end of the positive-side output resistor to make a current corresponding to a voltage supplied to its gate terminal flow to the positive-side output resistor, a negative-side output unit connected to the positive-side output unit and including a negative-side output resistor and a negative-side transistor having its source terminal connected to one end of the negative-side output resistor to make a current corresponding to a voltage supplied to its gate terminal flow to the negative-side output resistor, a positive-side bias generating unit which generates a positive-side bias voltage corresponding to the input voltage, a negative-side bias generating unit which generates a negative-side bias voltage corresponding to the input voltage, a positive-side control unit which controls the voltage to be applied to the gate terminal of the positive-side transistor in a manner that positive-side bias voltage and the source voltage of the positive-side transistor become generally equal, and a negative-side control unit which controls the voltage to be applied to the gate terminal of the negative-side transistor in a manner that the negative-side bias voltage and the source voltage of the negative-side transistor become generally equal, thereby outputting the voltage at the connection node between the positive-side output unit and the negative-side output unit as the output voltage.

The positive-side output unit and the negative-side output unit may be connected at the other end of the positive-side output resistor and the other end of the negative-side output resistor. Further, the positive-side output unit and the negative-side output unit may be connected at the drain terminal of the positive-side transistor and the drain terminal of the negative-side transistor.

According to a second mode of the present invention, there is provided a test apparatus which tests a device under test, and includes a power amplifier circuit which is supplied with an input voltage to be applied to the device under test to supply power source electricity to the device under test based on the input voltage, and a determining unit which detects an operation of the device under test supplied with the power source electricity to determine whether the device under test is good or bad, wherein the power amplifier circuit includes a positive-side output unit including a positive-side output resistor and a positive-side transistor having its source terminal connected to one end of the positive-side output resistor to make a current corresponding to a voltage supplied to its gate terminal flow to the positive-side output resistor, a negative-side output unit connected to the positive-side output unit and including a negative-side output resistor and a negative-side transistor having its source terminal connected to one end of the negative-side output resistor to make a current corresponding to a voltage supplied to its gate terminal flow to the negative-side output resistor, a positive-side bias generating unit which generates a positive-side bias voltage corresponding to the input voltage, a negative-side bias generating unit which generates a negative-side bias voltage corresponding to the input voltage, a positive-side control unit which controls the voltage to be applied to the gate terminal of the positive-side transistor in a manner that the positive-side bias voltage and the source voltage of the positive-side transistor become generally equal, and a negative-side control unit which controls the voltage to be applied to the gate terminal of the negative-side transistor in a manner that the negative-side bias voltage and the source voltage of the negative-side transistor become generally equal, and wherein the power amplifier circuit outputs the voltage at the connection node between the positive-side output unit and the negative-side output unit as the output voltage.

The test apparatus may test a plurality of devices under test in parallel and include the power amplifier circuit for each of the devices under test.

The above summary of the invention does not recite all the necessary features of the present invention, and sub-combinations of these features could also be inventions.

DESCRIPTION OF EXEMPLARY
EMBODIMENTS

One aspect of the present invention will be explained below through embodiments of the invention, but the embodiments below are not intended to limit the invention set forth in the claims and all the combinations of the features explained in the embodiments are not necessarily indispensable to the means of solving provided by the present invention.

Figure 1:
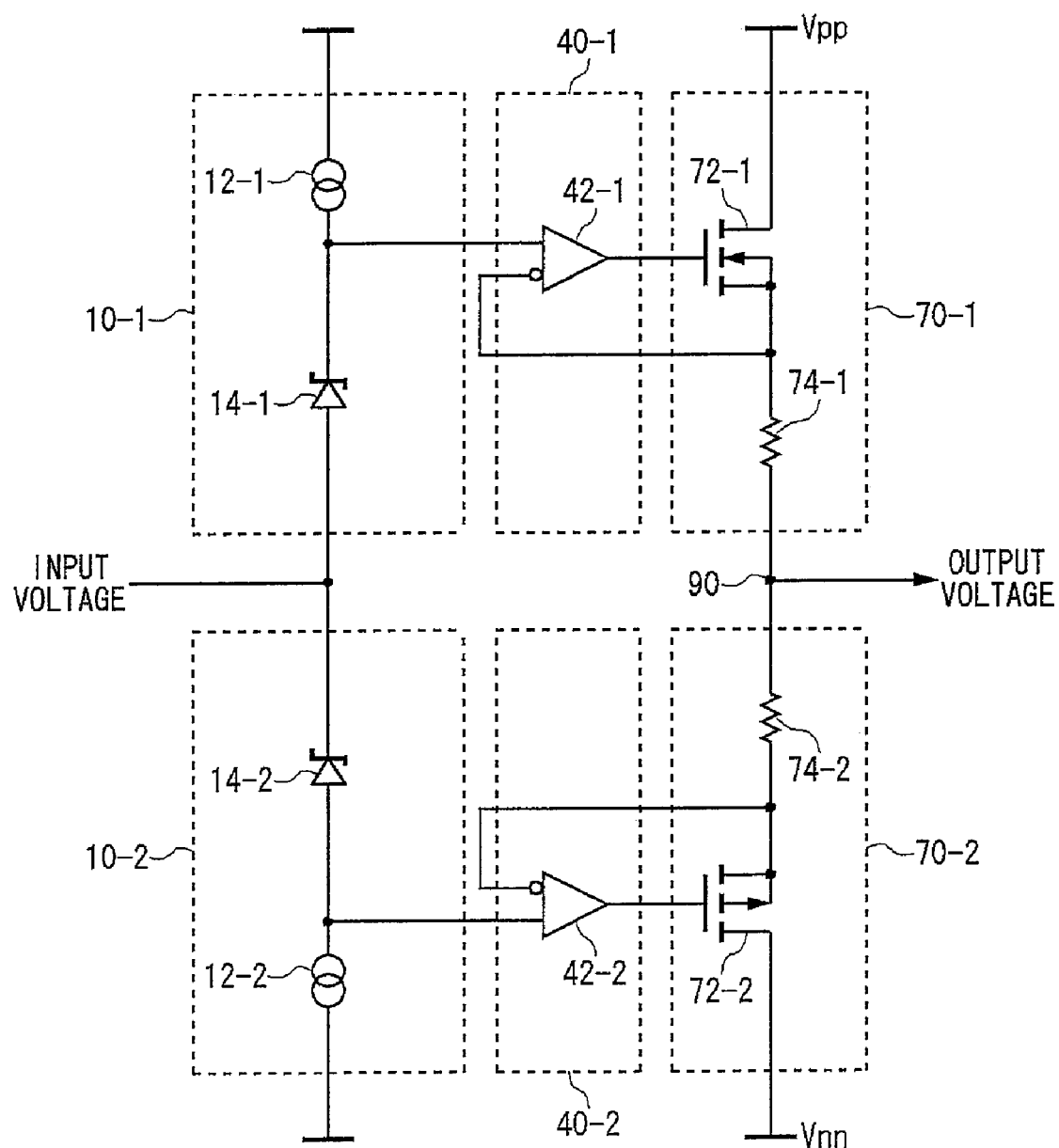
FIG. 1 is a diagram illustrating a first example of the configuration of a power amplifier circuit 100 according to an embodiment of the present invention.

FIG. 1 is a diagram illustrating a first example of the configuration of a power amplifier circuit 100 according to an embodiment of the present invention. The power amplifier circuit 100 is a circuit which outputs an output voltage corresponding to an input voltage supplied thereto. In the present example, a positive-side control unit 40-1 and a negative-side control unit 40-2 control the source voltage of a positive-side transistor 72-1 and negative-side transistor 72-2 at the output stage to have a constant value, so that an idling current flowing through the output stage may be constant and these transistors may be driven at desired regions thereof.

The power amplifier circuit 100 includes a positive-side bias generating unit 10-1, a negative-side bias generating unit 10-2, a positive-side control unit 40-1, a negative-side control unit 40-2, a positive-side output unit 70-1, and a negative-side output unit 70-2.

The positive-side bias generating unit 10-1 and the negative-side bias generating unit 10-2 generate a positive-side bias voltage and a negative-side bias voltage based on an input voltage supplied thereto. In the present example, the positive-side bias generating unit 10-1 generates the positive-side bias voltage by adding a predetermined voltage to the input voltage, and the negative-side bias generating unit 10-2 generates the negative-side bias voltage by subtracting a predetermined voltage from the input voltage.

The positive-side bias generating unit 10-1 includes a voltage step-up unit 14-1 and a norator 12-1. The voltage step-up unit 14-1 receives the input voltage at its one end, and has its other end connected to a positive potential Vpp via the norator 12-1. The voltage step-up unit 14-1 adds a predetermined voltage to the received input voltage and outputs the result. In the present example, the voltage step-up unit 14-1 comprises a zener diode. The voltage step-up unit 14-1 generates the positive-side bias voltage by stepping up the input voltage by an amount of step-up determined by the zener diode.

The negative-side bias generating unit 10-2 includes a voltage step-down unit 14-2 and a norator 12-2. The voltage step-down unit 14-2 receives the input voltage at its one end, and has its other end connected to a negative potential Vnn via the norator 12-2. The voltage step-down unit 14-2 subtracts a predetermined voltage from the received input voltage, and outputs the result. Here, the amount of voltage stepped up by the voltage step-up unit 14-1 and the amount of voltage stepped down by the voltage step-down unit 14-2 are generally equal to each other. In the present example, the voltage step-down unit 14-2 comprises a zener diode that has generally the same characteristics as those of the zener diode of the voltage step-up unit 14-1. The voltage step-down unit 14-2 generates the negative-side bias voltage by stepping down the input voltage by an amount of step-down determined by the zener diode.

The positive-side output unit 70-1 includes a positive-side transistor 72-1 and a positive-side output resistor 74-1. The negative-side output unit 70-2 includes a negative-side transistor 72-2 and a negative-side output resistor 74-2. Here, the resistance value of the positive-side output resistor 74-1 and the resistance value of the negative-side output resistor 74-2 are generally equal to each other. Further, in the present example, the positive-side transistor 72-1 is an n-type MOSFET while the negative-side transistor 72-2 is a p-type MOSFET.

The positive-side transistor 72-1 has its drain terminal connected to the predetermined positive potential Vpp and its source terminal connected to the positive-side output resistor 74-1, thereby making a current corresponding to a voltage supplied to its gate terminal flow to the positive-side output resistor 74-1. The negative-side transistor 72-2 has its drain terminal connected to the predetermined negative potential Vnn and its source terminal connected to the negative-side output resistor 74-2, thereby making a current corresponding to a voltage supplied to its gate terminal flow to the negative-side output resistor 74-2.

The positive-side output resistor 74-1 and the negative-side output resistor 74-2 are connected in series between the source terminal of the positive-side transistor 72-1 and the source terminal of the negative-side transistor 72-2. A voltage at the connection node between the positive-side output resistor 74-1 and the negative-side output resistor 74-2 is output to the outside as an output voltage.

The positive-side control unit 40-1 controls a voltage to be applied to the gate terminal of the positive-side transistor 72-1 in a manner that the positive-side bias voltage output from the positive-side bias generating unit 10-1 and the source voltage of the positive-side transistor become generally equal to each other. That is, the positive-side control unit 40-1 controls a current which the positive-side transistor 72-1 is to make flow to the positive-side output resistor 74-1, in a manner that the positive-side bias voltage and the source voltage become generally equal to each other. The positive-side control unit 40-1 may receive the positive-side bias voltage at its non-inverting input terminal, and may be provided, at its inverting input terminal, with a differential amplifier 42-1 for receiving the source voltage of the positive-side transistor 72-1.

The negative-side control unit 40-2 controls a voltage to be applied to the gate terminal of the negative-side transistor 72-2, in a manner that the negative-side bias voltage output from the negative-side bias generating unit 10-2 and the source voltage of the negative-side transistor become generally equal to each other. That is, the negative-side control unit 40-2 controls a current which the negative-side transistor 72-2 is to make flow to the negative-side output resistor 74-2, in a manner that the negative-side bias voltage and the source voltage become generally equal to each other. The negative-side control unit 40-2 may receive the negative-side bias voltage at its non-inverting input terminal, and may be provided, at its inverting input terminal, with a differential amplifier 42-2 for receiving the source voltage of the negative-side transistor 72-2.

With this configuration, the idling current that will flow through the positive-side output resistor 74-1 and negative-side output resistor 74-2 when the power amplifier circuit 100 is idling will be constant. That is, the idling current Id is given by the following equation, where the voltage stepped up by the voltage step-up unit 14-1 is VB_p, the voltage stepped down by the voltage step-down unit 14-2 is VB_n, the resistance value of the positive-side output resistor 74-1 is Ro_p, and the resistance value of the negative-side output resistor 74-2 is Ro_n.

$$Id=(VB\_p-VB\_n)/(Ro\_p+Ro\_n) \quad \text{equation (1)}$$

The positive-side control unit 40-1 and the negative-side control unit 40-2 control the positive-side transistor 72-1 and the negative-side transistor 72-2, such that the idling current takes the value represented by the equation (1). In this manner, the power amplifier circuit 100 of the present example can control the idling current to have a predetermined value, regardless of the characteristics of the positive-side transistor 72-1 and negative-side transistor 72-2. Hence, it is possible to activate these transistors at predetermined operational regions thereof. Further, in a case where a plurality of power amplifier circuits 100 are used in parallel, it is possible to control the idling currents of the respective power amplifier circuits 100 to have a constant value regardless of any variations in the characteristics of the transistors included.

Figure 2:
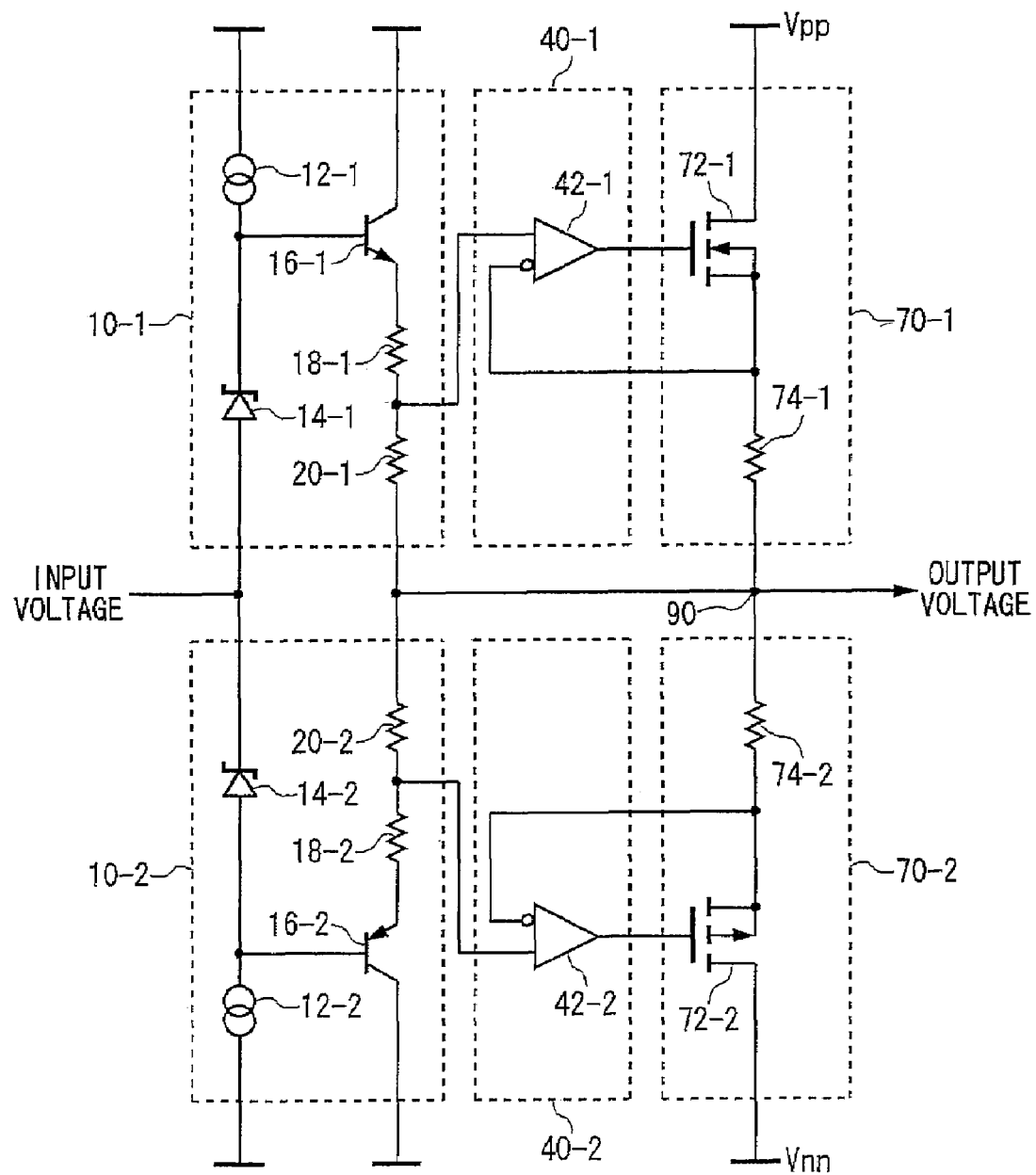
FIG. 2 is a diagram illustrating a second example of the configuration of the power amplifier circuit 100.

FIG. 2 is a diagram illustrating a second example of the configuration of the power amplifier circuit 100. The power amplifier circuit 100 of the present example is a circuit that can adjust its output impedance while controlling the idling current so as to be constant and suppressing the power that is to be consumed at its output stage. The power amplifier circuit 100 of the present example is different from the power amplifier circuit 100 shown in FIG. 1, regarding the configuration of the positive-side bias generating unit 10-1 and negative-side bias generating unit 10-2. The other elements are the same as the elements of the power amplifier circuit 100 explained with reference to FIG. 1.

The positive-side bias generating unit 10-1 further includes a positive-side buffer transistor 16-1, a first positive-side voltage dividing resistor 18-1, and a second positive-side voltage dividing resistor 20-1, in addition to the elements of the positive-side bias generating unit 10-1 explained with reference to FIG. 1. The negative-side bias generating unit 10-2 further includes a negative-side buffer transistor 16-2, a first negative-side voltage dividing resistor 18-2, and a second negative-side voltage dividing resistor 20-2, in addition to the elements of the negative-side bias generating unit 10-2 explained with reference to FIG. 1.

The positive-side buffer transistor 16-1 has its collector terminal connected to a predetermined positive potential Vpp, its emitter terminal connected to the first positive-side voltage dividing resistor 18-1, and its base terminal connected to the output end of the voltage step-up unit 14-1. The negative-side buffer transistor 16-1 has its collector terminal connected to a predetermined negative potential Vnn, its emitter terminal connected to the first negative-side voltage dividing resistor 18-2, and its base terminal connected to the output end of the voltage step-down unit 14-2. In the present example, the positive-side buffer transistor 16-1 is an npn-type bipolar transistor and the negative-side buffer transistor 16-2 is a pnp-type bipolar transistor.

The first positive-side voltage dividing resistor 18-1, the second positive-side voltage dividing resistor 20-1, the second negative-side voltage dividing resistor 20-2, and the first negative-side voltage dividing resistor 18-2 are connected in series in this order between the emitter terminal of the positive-side buffer transistor 16-1 and the emitter terminal of the negative-side buffer transistor 16-2.

The first positive-side voltage dividing resistor 18-1 and the second positive-side voltage dividing resistor 20-1 receive, via the positive-side buffer transistor 16-1, a voltage stepped up by the voltage step-up unit 14-1, divide the received voltage at the ratio between their own resistance values, and supplies the resulting voltage to the positive-side control unit 40-1 as the positive-side bias voltage. That is, the voltage at the connection node between the first positive-side voltage dividing resistor 18-1 and the second positive-side voltage dividing resistor 20-1 is supplied to the positive-side control unit 40-1 as the positive-side bias voltage.

The first negative-side voltage dividing resistor 18-2 and the second negative-side voltage dividing resistor 20-2 receive, via the negative-side buffer transistor 16-2, a voltage stepped up by the voltage step-down unit 14-2, divide the received voltage at the ratio between their own resistance values, and supply the resulting voltage to the negative-side control unit 40-2 as the negative-side bias voltage. That is, the voltage at the connection node between the first negative-side voltage dividing resistor 18-2 and the second negative-side voltage dividing resistor 20-2 is supplied to the negative-side control unit 40-2 as the negative-side bias voltage. Here, the resistance value of the first positive-side voltage dividing resistor 18-1 and the resistance value of the first negative-side voltage dividing resistor 18-2 are generally equal to each other, and the resistance value of the second positive-side voltage dividing resistor 20-1 and the resistance value of the second negative-side voltage dividing resistor 20-2 are generally equal to each other.

The connection node between the second positive-side voltage dividing resistor 20-1 and the second negative-side voltage dividing resistor 20-2 is connected to the connection node between the positive-side output resistor 74-1 and the negative-side output resistor 74-2. According to this configuration, the idling current Id is given by the following equation, where the base-emitter voltage of the positive-side buffer transistor 16-1 is Vbe_p, the base-emitter voltage of the negative-side buffer transistor 16-2 is Vbe_n, the resistance value of the first positive-side voltage dividing resistor 18-1 is Rc1_p, the resistance value of the second positive-side voltage dividing resistor 20-1 is Rc2_p, the resistance value of the first negative-side voltage dividing resistor 18-2 is Rc1_n, and the resistance value of the second negative-side voltage dividing resistor 20-2 is Rc2_n.

$$Id = ((VB\_p - Vbe\_p) \times Rc2\_p/(Rc1\_p + Rc2\_p)) - (VB\_n - Vbe\_n) \times Rc2\_n/(Rc1\_n + Rc2\_n))/(Ro\_p + Ro\_n) \quad \text{equation (2)}$$

As obvious from the equation (2), the idling current Id will take a constant value regardless of the characteristics of the transistors at the output stage. The output impedance Zo of the power amplifier circuit 100 is given by the following equation.

$$Zo = Ro\_p \times (Rc1\_p + Rc2\_p)/Rc2\_p \quad \text{equation (3)}$$
$$= Ro\_n \times (Rc1\_n + Rc2\_n)/Rc2\_n$$

As obvious from the equation (3), it is possible to control the output impedance Zo by adjusting the ratio between the first voltage dividing resistor 18 and the second voltage dividing resistor 20 at either the positive side or the negative side. That is, even in a case where what is aimed for is to increase the output impedance Zo, it is possible to use the output resistor 74 at either the positive side or the negative side that has a smaller resistance value, and to therefore suppress the positive potential Vpp or the negative potential Vnn that is supplied as the power to drive the power amplifier circuit 100 to a low level. Hence, it is possible to control the output impedance Zo while suppressing the power to be consumed by the power amplifier circuit 100.

In the present example, it is preferred that the resistance value of the positive-side output resistor 74-1 be smaller than the resistance values of both the two positive-side voltage dividing resistors (18-1, 20-1), and that the resistance value of the negative-side output resistor 74-2 be smaller than the resistance values of both the two negative-side voltage dividing resistors (18-2, 20-2). For example, the resistance values of both the output resistors may be 1Ω or smaller, and the resistance values of the voltage dividing resistors of both the sides may be some kΩ.

Figure 3:
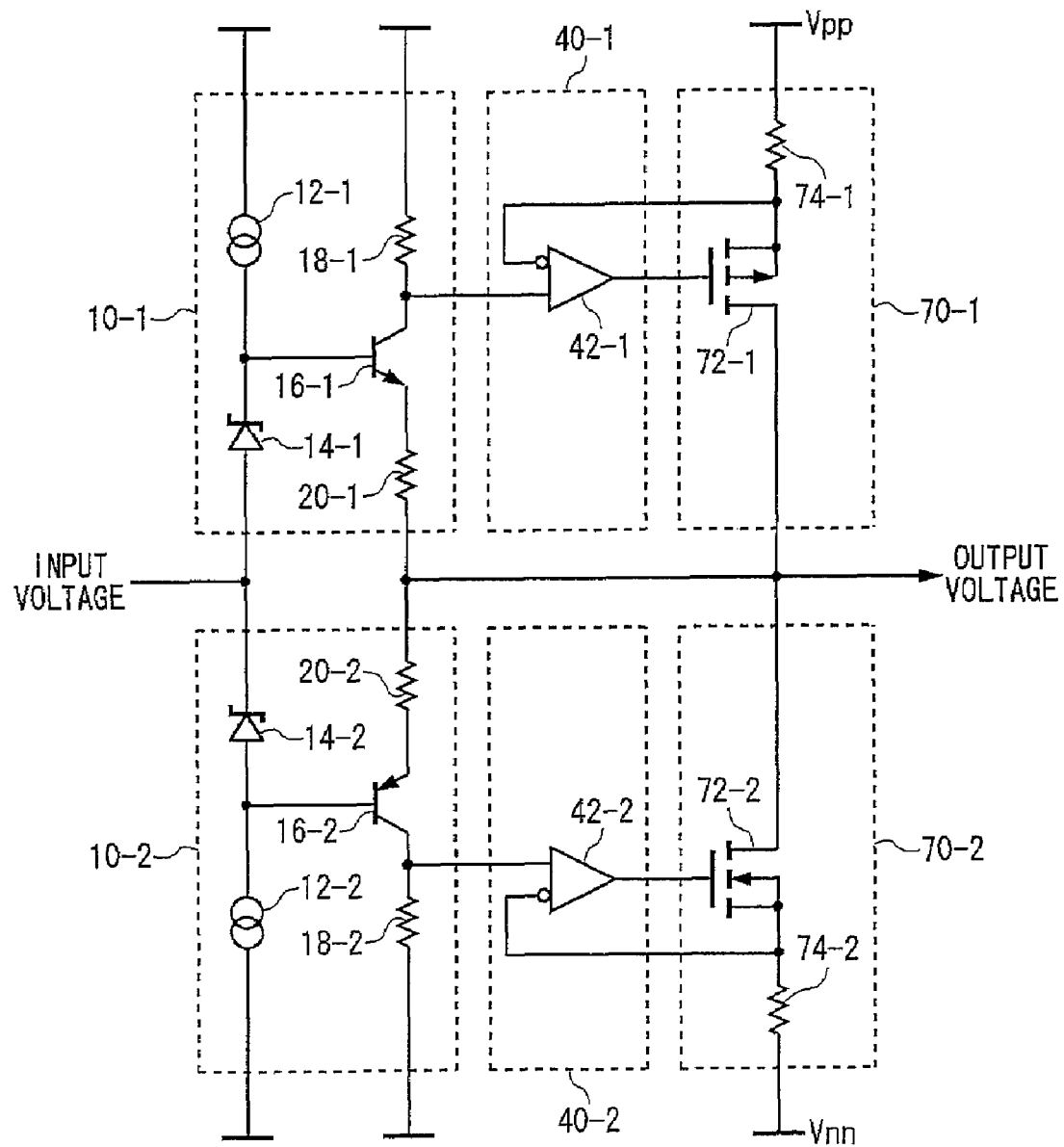
FIG. 3 is a diagram illustrating a third example of the configuration of the power amplifier circuit 100.

FIG. 3 is a diagram illustrating a third example of the configuration of the power amplifier circuit 100. In the configuration of the power amplifier circuit 100 of the present example, the polarities of the positive-side transistor 72-1 and negative-side transistor 72-2 are reversed from what they are in the power amplifier circuit 100 explained with reference to FIG. 2. That is, in the power amplifier circuit 100 of the present example, the positive-side transistor 72-1 is a p-type MOSFET whereas the negative-side transistor 72-2 is an n-type MOSFET.

In this case, the positive-side output resistor 74-1 is provided between the source terminal of the positive-side transistor 72-1 and a predetermined positive potential Vpp, and the negative-side output resistor 74-2 is provided between the source terminal of the negative-side transistor 72-2 and a predetermined negative potential Vnn. The drain terminal of the positive-side transistor 72-1 and the drain terminal of the negative-side transistor 72-2 are connected to each other, and the voltage at their connection node is output to the outside as an output voltage. With this configuration too as well as the power amplifier circuit 100 explained with reference to FIG. 1 or FIG. 2, the idling current can be held at a predetermined value regardless of the characteristics of the transistors at the output stage.

Further, as shown in FIG. 3, in the positive-side and negative-side bias generating units 10, the first voltage dividing resistor 18 may be provided between the collector terminal of the buffer transistor 16 and the predetermined positive potential Vpp, and the second voltage dividing resistor 20 may be connected to the source terminal of the buffer transistor 16. In this case, the voltage at the connection node between the collector terminal of the buffer transistor 16 and the first voltage dividing resistor 18 is supplied to the positive-side or negative-side control unit 40 as the bias voltage. With this configuration too as well as the power amplifier circuit 100 explained with reference to FIG. 2, it is possible to adjust the output impedance Zo.

Figure 4:
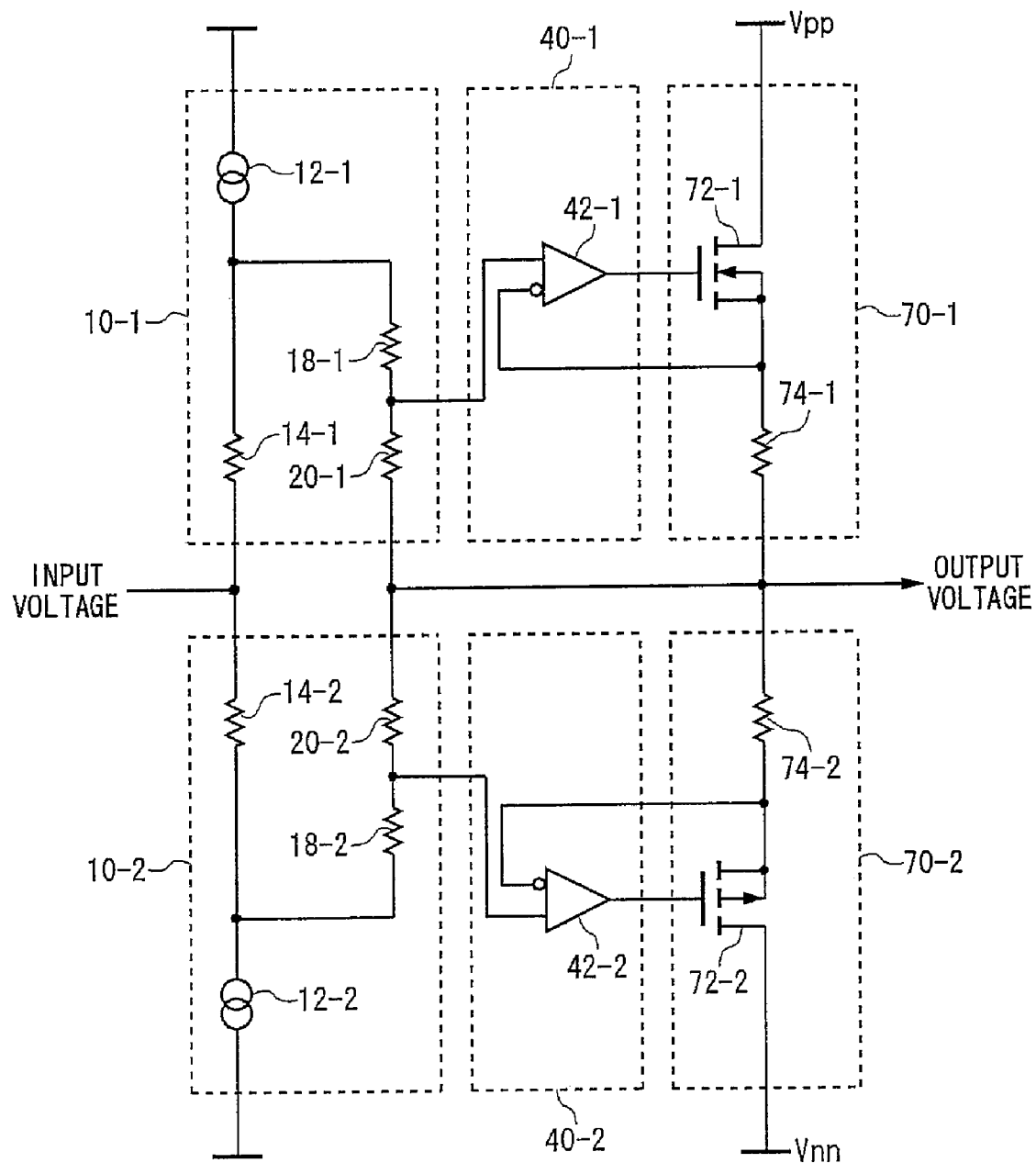
FIG. 4 is a diagram illustrating a fourth example of the configuration of the power amplifier circuit 100.

FIG. 4 is a diagram illustrating a fourth example of the configuration of the power amplifier circuit 100. The power amplifier circuit 100 of the present example generates a bias voltage by resistors in the positive-side and negative-side bias generating units 10. Since the forward voltage of a zener diode and the base-emitter voltage of a transistor tend to be unstable, a desired bias voltage may not be generated if such a diode or a transistor is used to generate a bias voltage. In this regard, as a resistor can be formed with its resistance adjusted precisely, the power amplifier circuit 100 of the present example can precisely generate a desired bias voltage.

The positive-side bias generating unit 10-1 uses a resistor as the voltage step-up unit 14-1. Further, the positive-side bias generating unit 10-1 of the present example does not include the positive-side buffer transistor 16-1, in contrast with the positive-side bias generating unit 10-1 explained with reference to FIG. 2. The first positive-side voltage dividing resistor 18-1 and the second positive-side voltage dividing resistor 20-1 are provided in series between the output end of the voltage step-up unit 14-1 and the connection node between the positive-side output resistor 74-1 and the negative-side output resistor 74-2.

The negative-side bias generating unit 10-2 has the same configuration as that of the positive-side bias generating unit 10-1 as illustrated in FIG. 4. With this configuration, it is possible to generate a desired bias voltage precisely, as said above.

Here, it is preferred that the resistance value of the resistor functioning as the voltage step-up unit 14-1 be sufficiently smaller than the resistance values of the first positive-side voltage dividing resistor 18-1 and second positive-side voltage dividing resistor 20-1. For example, it is preferred that the voltage step-up unit 14-1 have such a resistance value as would make generally all the current flowing through the norator 12-1 flow thereto. Likewise, it is preferred that the resistance value of the resistor functioning as the voltage step-down unit 14-2 be sufficiently smaller than the resistance values of the first negative-side voltage dividing resistor 18-2 and the second negative-side voltage dividing resistor 20-2.

Figure 5:
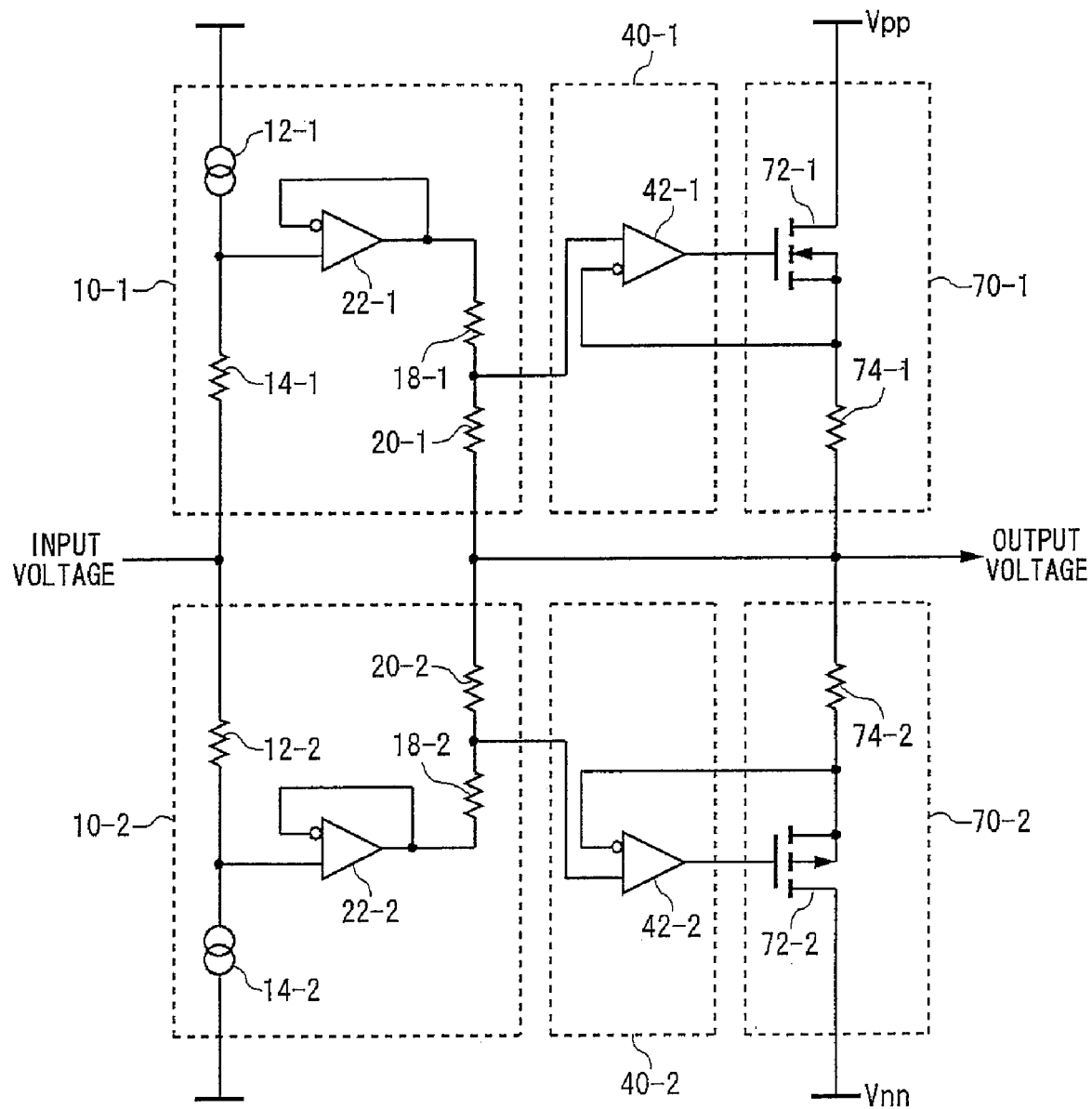
FIG. 5 is a diagram illustrating a fifth example of the configuration of the power amplifier circuit 100.

FIG. 5 is a diagram illustrating a fifth example of the configuration of the power amplifier circuit 100. The power amplifier circuit 100 of the present example includes a voltage follower circuit 22 in the positive-side and negative side bias generating units 10, in addition to the configuration of the power amplifier circuit 100 explained with reference to FIG. 4.

The positive-side bias generating unit 10-1 has the voltage follower circuit 22-1 between the output end of the voltage step-up unit 14-1 and the first positive-side voltage dividing resistor 18-1. The negative-side bias generating unit 10-2 has the voltage follower circuit 22-2 between the output end of the voltage step-down unit 14-2 and the first negative-side voltage dividing resistor 18-2. With this configuration, the voltage generated by the voltage step-up unit 14-1 or the voltage step-down unit 14-2 can precisely be transferred to the first positive-side voltage dividing resistor 18-1 or the first negative-side voltage dividing resistor 18-2.

The power amplifier circuit 100 may further include a resistance control unit which controls the resistance values of the first voltage dividing resistors 18 and second voltage dividing resistors 20. With this, the output impedance of the power amplifier circuit 100 can be controlled to a desired value.

Figure 6:
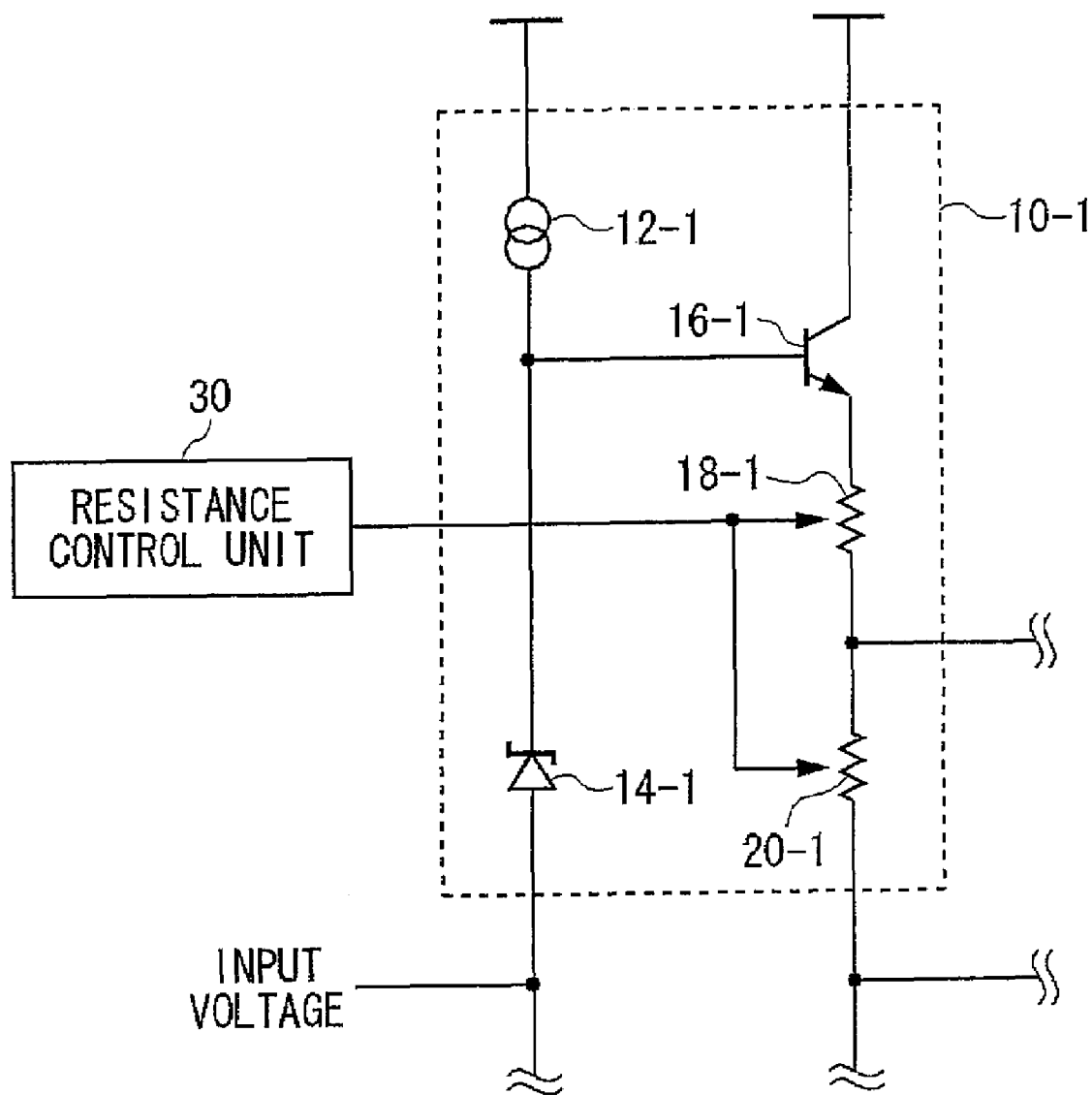
FIG. 6 is a diagram explaining a resistance control unit 30.

FIG. 6 is a diagram explaining the resistance control unit 30 included in the power amplifier circuit 100. The resistance control unit 30 controls the resistance values of the first voltage dividing resistors 18 and second voltage dividing resistors 20 in the positive-side and negative side bias generating units 10. FIG. 6 explains a case that the resistance values of the first positive-side voltage dividing resistor 18-1 and second positive-side voltage dividing resistor 20-1 of the positive-side bias generating unit 10-1 are controlled.

As explained in relation to the equation (3), the resistance control unit 30 can easily control the value of the output impedance by controlling the ratio of resistance between the first positive-side voltage dividing resistor 18-1 and the second positive-side voltage dividing resistor 20-1. The first positive-side voltage dividing resistor 18-1 and the second positive-side voltage dividing resistor 20-1 may, for example, be a variable resistor. Further, when controlling the resistance values of the voltage dividing resistors in the positive-side bias generating unit 10, the resistance control unit 30 also controls the resistance values of the voltage dividing resistors in the negative-side bias generating unit 10 in the same manner.

Figure 7:
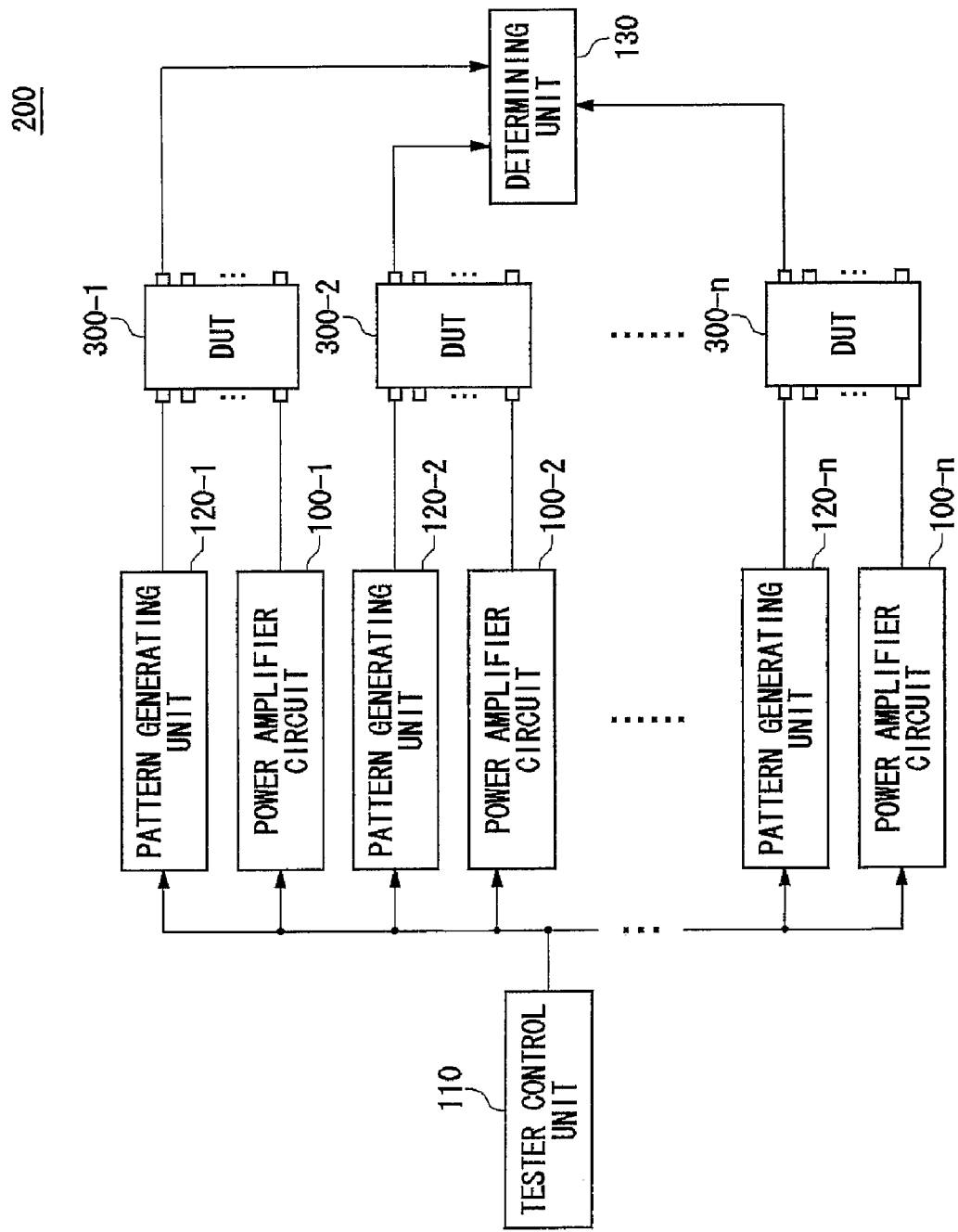
FIG. 7 is a diagram illustrating one example of the configuration of a test apparatus 200 according to an embodiment of the present invention.

FIG. 7 is a diagram illustrating one example of the configuration of a test apparatus 200 according to an embodiment of the present invention. The test apparatus 200 is an apparatus for testing a plurality of devices under test 300 in parallel, and includes a plurality of pattern generating units (120-1 to 120-n, n being an arbitrary integer), a plurality of power amplifier circuits (100-1 to 100-n), a tester control unit 110, and a determining unit 130. The device under test 300 is an electronic device such as a semiconductor circuit, etc.

The plurality of power amplifier circuits 100 are provided correspondingly to the plurality of devices under test 300. The plurality of power amplifier circuits 100 each have the same configuration as that of the power amplifier circuit 100 explained with reference to FIG. 1 to FIG. 6, and supply power source electricity to the corresponding devices under test 300.

The plurality of pattern generating units 120-1 are provided correspondingly to the plurality of devices under test 300. Each pattern generating unit 120-1 supplies a test pattern for testing the device under test 300 to the corresponding device under test 300.

The tester control unit 110 controls the plurality of pattern generating units 120 and the plurality of power amplifier circuits 100 to supply a predetermined test pattern and a power source voltage to the respective devices under test 300. The determining unit 130 detects the operation of the devices under test 300 to which the power source electricity is supplied, and determines whether each device under test 300 is good or bad. For example, the determining unit 130 may determine whether good or bad based on an output signal output from the devices under test 300, or may detect a power source current supplied to the devices under test 300 and determine whether the devices under test 300 are good or bad based on the detected power source current.

It is preferred that the voltage step-up units 14-1 and the voltage step-down units 14-2 of the respective power amplifier circuits 100 of the present example generate the same stepped-up voltage or the same stepped-down voltage. For example, the voltage step-up units 14-1 and the voltage step-down units 14-2 of the respective power amplifier circuits 100 may comprise zener diodes having the same characteristics.

Thus, the idling currents in the respective power amplifier circuits 100 can be the same. Accordingly, the respective devices under test 300 can be tested with high accuracy.

One aspect of the present invention has thus been explained through the embodiments, but the technical scope of the present invention is not limited to the scope of disclosures of the foregoing embodiments. Various modifications or alterations can be made upon the foregoing embodiments. It is apparent from the statements of the claims that any embodiments upon which such modifications or alterations are made could also be included in the technical scope of the present invention.

As obvious from the above explanation, according to one embodiment of the present invention, it is possible to provide a power amplifier circuit in which an idling current takes a predetermined value regardless of the characteristics of transistors at the output stage thereof.

What is claimed is:

1. A power amplifier circuit which outputs an output voltage corresponding to an input voltage supplied thereto, comprising:

a positive-side output unit which includes a positive-side output resistor, and a positive-side transistor having its source terminal connected to one end of the positive-side output resistor to make a current corresponding to a voltage supplied to its gate terminal flow to the positive-side output resistor;

a negative-side output unit which is connected to the positive-side output unit and includes a negative-side output resistor, and a negative-side transistor having its source terminal connected to one end of the negative-side output resistor to make a current corresponding to a voltage supplied to its gate terminal flow to the negative-side output resistor;

a positive-side bias generating unit which generates a positive-side bias voltage corresponding to the input voltage;

a negative-side bias generating unit which generates a negative-side bias voltage corresponding to the input voltage;

a positive-side control unit which controls the voltage to be applied to the gate terminal of the positive-side transistor in a manner that the positive-side bias voltage and a source voltage of the positive-side transistor become generally equal;

a negative-side control unit which controls the voltage to be applied to the gate terminal of the negative-side transistor in a manner that the negative-side bias voltage and a source voltage of the negative-side transistor become generally equal; and a resistance control unit which controls an output impedance of the power amplifier circuit by controlling the resistance values of at least one of the resistors included in the power amplifier circuit, wherein the power amplifier circuit outputs a voltage at a connection node between the positive-side output unit and the negative-side output unit, as the output voltage.

2. The power amplifier circuit according to claim 1, wherein the positive-side output unit and the negative-side output unit are connected at the other end of the positive-side output resistor and the other end of the negative-side output resistor.

3. The power amplifier circuit according to claim 1, wherein the positive-side output unit and the negative-side output unit are connected at a drain terminal of the positive-side transistor and a drain terminal of the negative-side transistor.

4. The power amplifier circuit according to claim 1, wherein:
the positive-side bias generating unit generates the positive-side bias voltage by adding a predetermined voltage to the input voltage; and
the negative-side bias generating unit generates the negative-side bias voltage by subtracting the predetermined voltage from the input voltage.

5. The power amplifier circuit according to claim 1, wherein:
the positive-side control unit includes an amplifier which receives the positive-side bias voltage at its non-inverting input terminal, and receives the source voltage of the positive-side transistor at its inverting input terminal; and
the negative-side control unit includes an amplifier which receives the negative-side bias voltage at its non-inverting input terminal, and receives the source voltage of the negative-side transistor at its inverting input terminal.

6. The power amplifier circuit according to claim 4, wherein the positive-side bias generating unit includes:
a voltage step-up unit which adds a predetermined voltage to the input voltage; and
two positive-side voltage dividing resistors which are provided in series between an output end of the voltage step-up unit and the connection node between the positive-side output unit and the negative-side output unit and supply a voltage obtained by dividing a voltage output from the voltage step-up unit to the positive-side control unit as the positive-side bias voltage, and
the negative-side bias generating unit includes:
a voltage step-down unit which subtracts the predetermined voltage from the input voltage; and
two negative-side voltage dividing resistors which are provided in series between an output end of the voltage step-down unit and the connection node between the positive-side output unit and the negative-side output unit and supply a voltage obtained by dividing a voltage output from the voltage step-down unit to the negative-side control unit as the negative-side bias voltage.

7. The power amplifier circuit according to claim 6, wherein:
a resistance value of the positive-side output resistor is smaller than resistance values of the two positive-side voltage dividing resistors; and
a resistance value of the negative-side output resistor is smaller than resistance values of the two negative-side voltage dividing resistors.

8. The power amplifier circuit according to claim 6, wherein a ratio of resistance between the two positive-side voltage dividing resistors and a ratio of resistance between the two negative-side voltage dividing resistors are controlled by the resistance control unit.

9. The power amplifier circuit according to claim 1, wherein the positive-side bias generating unit includes:
a voltage step-up unit which adds a predetermined voltage to the input voltage; and
a positive-side bias transistor which has its collector terminal connected to a predetermined positive potential via a first positive-side voltage dividing resistor and its emitter terminal connected to the connection node via a second positive-side voltage dividing resistor, receives at its gate terminal a voltage output from the voltage step-up unit, and supplies its collector voltage to the positive-side control unit as the positive-side bias voltage, and
the negative-side bias generating unit includes:
a voltage step-down unit which subtracts the predetermined voltage from the input voltage; and
a negative-side bias transistor which has its collector terminal connected to a predetermined negative potential via a first negative-side voltage dividing resistor and its emitter terminal connected to the connection node via a second negative-side voltage dividing resistor, receives at its gate terminal a voltage output from the voltage step-down unit, and supplies its collector voltage to the negative-side control unit as the negative-side bias voltage.

10. A test apparatus which tests a device under test, comprising:
a power amplifier circuit which is supplied with an input voltage to be applied to the device under test and supplies power source electricity to the device under test based on the input voltage; and
a determining unit which detects an operation of the device under test to which the power source electricity is supplied, to determine whether the device under test is good or bad,
wherein the power amplifier circuit includes:
a positive-side output unit which includes a positive-side output resistor, and a positive-side transistor having its source terminal connected to one end of the positive-side output resistor to make a current corresponding to a voltage supplied to its gate terminal flow to the positive-side output resistor;
a negative-side output unit which is connected to the positive-side output unit and includes a negative-side output resistor, and a negative-side transistor having its source terminal connected to one end of the negative-side output resistor to make a current corresponding to a voltage supplied to its gate terminal flow to the negative-side output resistor;
a positive-side bias generating unit which generates a positive-side bias voltage corresponding to the input voltage;
a negative-side bias generating unit which generates a negative-side bias voltage corresponding to the input voltage;
a positive-side control unit which controls the voltage to be applied to the gate terminal of the positive-side transistor in a manner that the positive-side bias voltage and a source voltage of the positive-side transistor become generally equal;
a negative-side control unit which controls the voltage to be applied to the gate terminal of the negative-side transistor in a manner that the negative-side bias voltage and a source voltage of the negative-side transistor become generally equal; and
a resistance control unit which controls an output impedance of the power amplifier circuit by controlling the resistance values of at least one of the resistors included in the power amplifier circuit,
wherein the power amplifier circuit outputs a voltage at a connection node between the positive-side output unit and the negative-side output unit as the output voltage.

11. The test apparatus according to claim 10, which tests a plurality of the device under test in parallel, and includes the power amplifier circuit for each of the devices under test.

12. The test apparatus according to claim 10, wherein the positive-side output unit and the negative-side output unit are connected at the other end of the positive-side output resistor and the other end of the negative-side output resistor.

13. The test apparatus according to claim 10, wherein the positive-side output unit and the negative-side output unit are connected at a drain terminal of the positive-side transistor and a drain terminal of the negative-side transistor.

14. A power amplifier circuit which outputs an output voltage corresponding to an input voltage supplied thereto, comprising:
   a positive-side output unit which includes a positive-side output resistor, and a positive-side transistor having its source terminal connected to one end of the positive-side output resistor to make a current corresponding to a voltage supplied to its gate terminal flow to the positive-side output resistor;
   a negative-side output unit which is connected to the positive-side output unit and includes a negative-side output resistor, and a negative-side transistor having its source terminal connected to one end of the negative-side output resistor to make a current corresponding to a voltage supplied to its gate terminal flow to the negative-side output resistor;
   a positive-side bias generating unit which generates a positive-side bias voltage corresponding to the input voltage by adding a predetermined voltage to the input voltage, the positive-side bias generating unit including:
      a voltage step-up unit which adds a predetermined voltage to the input voltage; and
      two positive-side voltage dividing resistors which are provided in series between an output end of the voltage step-up unit and the connection node between the positive-side output unit and the negative-side output unit and supply a voltage obtained by dividing a voltage output from the voltage step-up unit to the positive-side control unit as the positive-side bias voltage;
   a negative-side bias generating unit which generates a negative-side bias voltage corresponding to the input voltage by subtracting the predetermined voltage from the input voltage, the negative-side bias generating unit including:
      a voltage step-down unit which subtracts the predetermined voltage from the input voltage; and
      two negative-side voltage dividing resistors which are provided in series between an output end of the voltage step-down unit and the connection node between the positive-side output unit and the negative-side output unit and supply a voltage obtained by dividing a voltage output from the voltage step-down unit to the negative-side control unit as the negative-side bias voltage;
   a positive-side control unit which controls the voltage to be applied to the gate terminal of the positive-side transistor in a manner that the positive-side bias voltage and a source voltage of the positive-side transistor become generally equal; and
   a negative-side control unit which controls the voltage to be applied to the gate terminal of the negative-side transistor in a manner that the negative-side bias voltage and a source voltage of the negative-side transistor become generally equal,
   wherein the power amplifier circuit outputs a voltage at a connection node between the positive-side output unit and the negative-side output unit, as the output voltage.

15. The power amplifier circuit according to claim 14, wherein:
   a resistance value of the positive-side output resistor is smaller than resistance values of the two positive-side voltage dividing resistors; and
   a resistance value of the negative-side output resistor is smaller than resistance values of the two negative-side voltage dividing resistors.

16. The power amplifier circuit according to claim 14, wherein a ratio of resistance between the two positive-side voltage dividing resistors and a ratio of resistance between the two negative-side voltage dividing resistors are controlled by the resistance control unit.

17. A test apparatus which tests a device under test, comprising:
   a power amplifier circuit which is supplied with an input voltage to be applied to the device under test and supplies power source electricity to the device under test based on the input voltage; and
   a determining unit which detects an operation of the device under test to which the power source electricity is supplied, to determine whether the device under test is good or bad,
   wherein the power amplifier circuit includes:
   a positive-side output unit which includes a positive-side output resistor, and a positive-side transistor having its source terminal connected to one end of the positive-side output resistor to make a current corresponding to a voltage supplied to its gate terminal flow to the positive-side output resistor;
   a negative-side output unit which is connected to the positive-side output unit and includes a negative-side output resistor, and a negative-side transistor having its source terminal connected to one end of the negative-side output resistor to make a current corresponding to a voltage supplied to its gate terminal flow to the negative-side output resistor;
   a positive-side bias generating unit which generates a positive-side bias voltage corresponding to the input voltage by adding a predetermined voltage to the input voltage, the positive-side bias generating unit including:
      a voltage step-up unit which adds a predetermined voltage to the input voltage; and
      two positive-side voltage dividing resistors which are provided in series between an output end of the voltage step-up unit and the connection node between the positive-side output unit and the negative-side output unit and supply a voltage obtained by dividing a voltage output from the voltage step-up unit to the positive-side control unit as the positive-side bias voltage;
   a negative-side bias generating unit which generates a negative-side bias voltage corresponding to the input voltage by subtracting the predetermined voltage from the input voltage, the negative-side bias generating unit including:
      a voltage step-down unit which subtracts the predetermined voltage from the input voltage; and
      two negative-side voltage dividing resistors which are provided in series between an output end of the voltage step-down unit and the connection node between the positive-side output unit and the negative-side output unit and supply a voltage obtained by dividing a voltage output from the voltage step-down unit to the negative-side control unit as the negative-side bias voltage;
   a positive-side control unit which controls the voltage to be applied to the gate terminal of the positive-side transistor in a manner that the positive-side bias voltage and a source voltage of the positive-side transistor become generally equal; and
   a negative-side control unit which controls the voltage to be applied to the gate terminal of the negative-side transistor in a manner that the negative-side bias voltage and a source voltage of the negative-side transistor become generally equal, and wherein the power amplifier circuit outputs a voltage at a connection node between the positive-side output unit and the negative-side output unit as the output voltage.

18. The test apparatus according to claim 17, which tests a plurality of the device under test in parallel, and includes the power amplifier circuit for each of the devices under test.

19. The test apparatus according to claim 17, wherein the positive-side output unit and the negative-side output unit are connected at the other end of the positive-side output resistor and the other end of the negative-side output resistor.

20. The test apparatus according to claim 17, wherein the positive-side output unit and the negative-side output unit are connected at a drain terminal of the positive-side transistor and a drain terminal of the negative-side transistor.

* * * * *